United States Patent
Anderson et al.

(10) Patent No.: US 9,240,352 B2
(45) Date of Patent: Jan. 19, 2016

(54) BULK FINFET WELL CONTACTS WITH FIN PATTERN UNIFORMITY

(71) Applicant: INTERNATIONAL BUSINESS MACHINES CORPORATION, Armonk, NY (US)

(72) Inventors: Brent A. Anderson, Jericho, VT (US); Andres Bryant, Burlington, VT (US); Edward J. Nowak, Essex Junction, VT (US); Scott R. Stiffler, Sharon, CT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 86 days.

(21) Appl. No.: 13/659,292

(22) Filed: Oct. 24, 2012

(65) Prior Publication Data
US 2014/0110767 A1    Apr. 24, 2014

(51) Int. Cl.
H01L 21/336 (2006.01)
H01L 21/8238 (2006.01)
H01L 27/092 (2006.01)

(52) U.S. Cl.
CPC .... H01L 21/823821 (2013.01); H01L 27/0924 (2013.01)

(58) Field of Classification Search
CPC ........................................................ H01L 29/78
USPC .......................................................... 438/283
See application file for complete search history.

(56) References Cited

U.S. PATENT DOCUMENTS

| | | | |
|---|---|---|---|
| 6,413,802 B1 * | 7/2002 | Hu et al. | 438/151 |
| 7,101,763 B1 * | 9/2006 | Anderson et al. | 438/285 |
| 7,238,601 B2 | 7/2007 | Varghese et al. | |
| 7,452,758 B2 | 11/2008 | Dyer et al. | |
| 7,517,764 B2 | 4/2009 | Booth, Jr. et al. | |
| 7,700,449 B2 | 4/2010 | Jam-Wem | |
| 7,800,165 B2 | 9/2010 | Sasaki et al. | |
| 7,968,394 B2 | 6/2011 | Orlowski et al. | |

(Continued)

FOREIGN PATENT DOCUMENTS

WO    2011080409 A3    9/2011

OTHER PUBLICATIONS

Okano, K. et al., "Process integration technology and device characteristics of CMOS FinFET on bulk silicon substrate with sub-10 nm fin width and 20 nm gate length," IEEE International Electron Devices Meeting, Dec. 5, 2005, pp. 721-724.

(Continued)

*Primary Examiner* — Eva Y Montalvo
*Assistant Examiner* — Mohammad M Hoque
(74) *Attorney, Agent, or Firm* — Michael Lestrange; Andrew M. Calderon; Roberts Mlotkowski Safran & Cole, P.C.

(57) ABSTRACT

Bulk finFET well contacts with fin pattern uniformity and methods of manufacture. The method includes providing a substrate with a first region and a second region, the first region comprising a well with a first conductivity. The method further includes forming contiguous fins over the first region and the second region. The method further includes forming an epitaxial layer on at least one portion of the fins in the first region and at least one portion of the fins in the second region. The method further includes doping the epitaxial layer in the first region with a first type dopant to provide the first conductivity. The method further includes doping the epitaxial layer in the second region with a second type dopant to provide a second conductivity.

17 Claims, 12 Drawing Sheets

(56) References Cited

U.S. PATENT DOCUMENTS

| | | | |
|---|---|---|---|
| 2004/0110331 A1* | 6/2004 | Yeo et al. | 438/199 |
| 2004/0126969 A1* | 7/2004 | Brown et al. | 438/257 |
| 2005/0026343 A1* | 2/2005 | Quek et al. | 438/197 |
| 2006/0202266 A1* | 9/2006 | Radosavljevic et al. | 257/344 |
| 2006/0273372 A1* | 12/2006 | Voldman et al. | 257/308 |
| 2007/0080409 A1* | 4/2007 | Seliskar | 257/401 |
| 2007/0085576 A1* | 4/2007 | Sanchez | 327/112 |
| 2007/0111419 A1* | 5/2007 | Doyle et al. | 438/197 |
| 2007/0272925 A1* | 11/2007 | Choi et al. | 257/51 |
| 2008/0224213 A1* | 9/2008 | Dyer et al. | 257/347 |
| 2009/0108351 A1* | 4/2009 | Yang et al. | 257/347 |
| 2009/0315112 A1* | 12/2009 | Lee | 257/355 |
| 2011/0316080 A1 | 12/2011 | Luo et al. | |
| 2012/0126884 A1* | 5/2012 | Juengling | 327/581 |
| 2012/0264269 A1* | 10/2012 | Ke et al. | 438/309 |
| 2012/0280250 A1* | 11/2012 | Basker et al. | 257/77 |
| 2012/0292715 A1* | 11/2012 | Hong et al. | 257/392 |
| 2013/0082282 A1* | 4/2013 | Suzuki | 257/77 |
| 2013/0200470 A1* | 8/2013 | Liu et al. | 257/408 |
| 2014/0061801 A1* | 3/2014 | Doornbos et al. | 257/351 |

OTHER PUBLICATIONS

Griffoni, A. et al., "Next generation bulk FinFET devices and their benefits for ESD robustness," 31st EOS/ESD Symposium, Aug. 30, 2009-Sep. 4, 2009, 10 pages.

* cited by examiner

BULK FINFET WELL CONTACTS WITH FIN PATTERN UNIFORMITY

FIELD OF THE INVENTION

The invention relates to semiconductor structures and methods of manufacture and, more particularly, to bulk finFET well contacts with fin pattern uniformity and methods of manufacture.

BACKGROUND

Bulk finFET devices can be fabricated for complementary metal-oxide-semiconductor (CMOS) technologies, particularly at the 22 nm node and beyond. The bulk finFET devices can be used in a variety of applications such as microprocessors, microcontrollers, and other digital logic circuits. N-well and P-well contacts are typically used in the layout of bulk finFET devices to avoid latch-up and ensure adequate device-to-device isolation electrically. However, the contact regions of the N-well and P-well disrupt regular fin patterning, and thus degrade uniformity of the layout of the bulk finFET devices. The degradation in uniformity of the layout of the bulk finFET devices results in variable patterning and etching, and consequently electrical degradation.

Accordingly, there exists a need in the art to overcome the deficiencies and limitations described hereinabove.

SUMMARY

In a first aspect of the invention, a method is provided comprising providing a substrate with a first region and a second region, the first region comprising a well with a first conductivity. The method further comprises forming contiguous fins over the first region and the second region. The method further comprises forming an epitaxial layer on at least one portion of the fins in the first region and at least one portion of the fins in the second region. The method further comprises doping the epitaxial layer in the first region with a first type dopant to provide the first conductivity. The method further comprises doping the epitaxial layer in the second region with a second type dopant to provide a second conductivity.

In another aspect of the invention, a method is provided comprising forming a well with a first conductivity type in a first region of a substrate. The method further comprises forming fins on the first region and a second region of the substrate in a uniform uninterrupted pattern. The method further comprises forming a first epitaxial layer with the first conductivity type on at least one portion of the fins in the first region. The method further comprises forming a second epitaxial layer with a second conductivity type on at least one portion of the fins in the second region.

In another aspect of the invention, a structure is provided comprising a substrate comprising a first region and a second region, the first region comprising a well with a first conductivity. The structure further comprises fins extending over the first region and the second region in an uninterrupted pattern, wherein a first section of the fins extends over the first region and a second section of the fins extends over the second region. The structure further comprises a dielectric layer formed surrounding a first portion of the fins. The structure further comprises an epitaxial layer formed surrounding a second portion of the fins on at least one portion of the first section of the fins and on at least one portion of the second section of the fins, the epitaxial layer on the at least one portion of the first section of the fins having the first conductivity and the epitaxial layer on the at least one portion of the second section of the fins having a second conductivity such that the at least one portion of the first section of the fins creates a contiguous charge-neutral zone from the epitaxial layer to the well. The structure further comprises at least one gate structure perpendicular to the fins and between the first region and the second region.

In yet another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the semiconductor structures, which comprises the structures of the present invention. In still further embodiments, a method in a computer-aided design system is provided for generating a functional design model of the semiconductor structures. The method comprises generating a functional representation of the structural elements of the semiconductor structures.

BRIEF DESCRIPTION OF THE SEVERAL VIEWS OF THE DRAWINGS

The present invention is described in the detailed description, which follows, in reference to the noted plurality of drawings by way of non-limiting examples of exemplary embodiments of the present invention.

DETAILED DESCRIPTION

The invention relates to semiconductor structures and methods of manufacture and, more particularly, to bulk finFET well contacts with fin pattern uniformity and methods of manufacture. More specifically, the present invention provides a fabrication process for providing bulk finFET well contacts on a high-density basis while maintaining fin pattern uniformity. In embodiments, the present invention provides gate-isolated fin contacts on logic pitch to introduce well contacts without disruption of fin patterns (e.g., a contiguous or uninterrupted fin pattern). That is, fins are provided over source/drain regions and at least one well contact of the finFET device without disruption of the fin patterns. In further embodiments, the finFET device can be manufactured in a gate-first or gate-last fabrication process, as should be understood by those of skill in the art.

Bulk finFET well contacts are used in the layout of bulk finFET devices to avoid latch-up and ensure adequate device-to-device isolation electrically. However, in conventional bulk finFET devices, the contact region of the well typically disrupts regular fin patterning, and thus degrades uniformity of the layout of the bulk finFET device. Accordingly, in embodiments of the present invention, the method of fabricating the bulk finFET device advantageously avoids latch-up and ensures adequate device-to-device electrical isolation, as well as maintains fin pattern uniformity. Also, advantageously, the fabrication processes of the present invention avoid inconsistency in the fin patterning throughout source/ drain regions and the well region of a bulk finFET device and thus avoids resultant electrical degradation. The fabrication processes of the present invention will thus improve device performance by avoiding electrical degradation from a lack of uniformity in the layout of bulk finFET devices.

Figure 1:
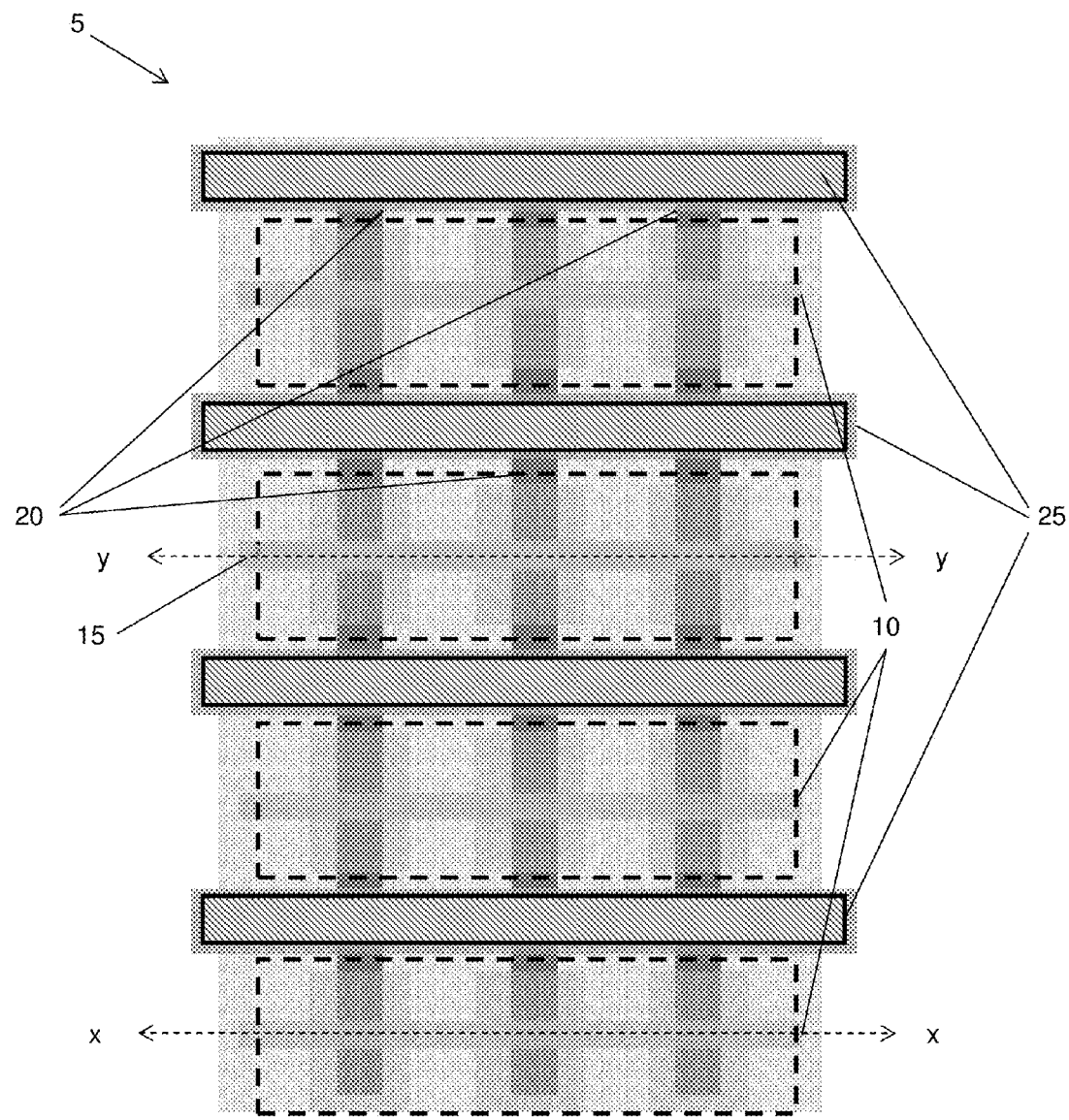
FIG. 1 shows a semiconductor structure in accordance with aspects of the present invention.

Referring to FIG. 1, in embodiments, the fabrication processes of the bulk finFET device 5 of the present invention utilize a double masking process to form source/drain regions 10 separate from that of a well region 15. Advantageously, patterned fins 20 can be formed directly over the gates 25 in an uninterrupted pattern extending over source/drain regions 10 and well region 15. In embodiments, the bulk finFET device 5 may be fabricated as an N-type device (e.g., an nFET) or a P-type device (e.g., a pFET).

Figure 2A:
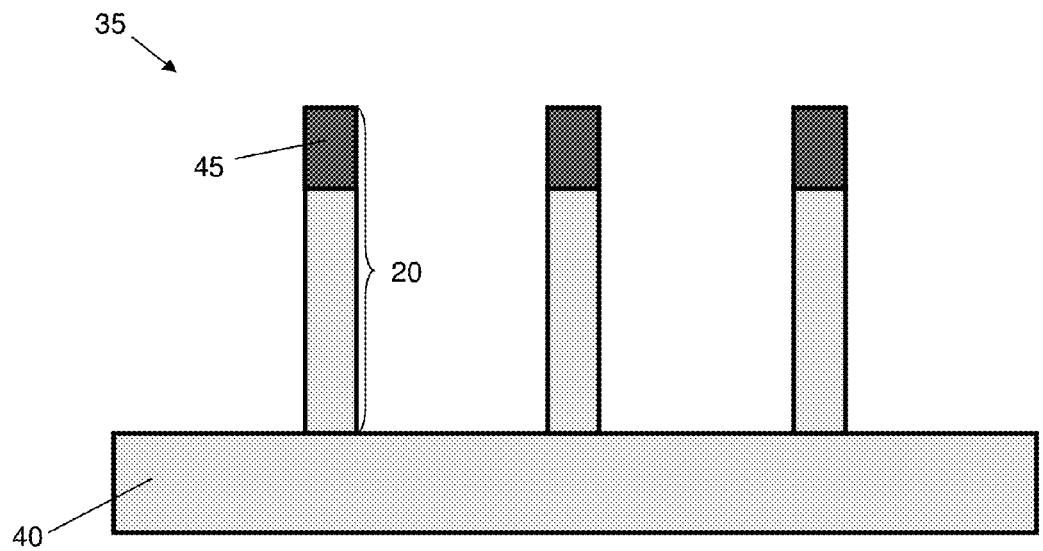
FIGS. 2a, 2b, 3a, 3b, 4a, 4b, 5a, 5b, 6a, 6b, 7a-7d, 8, and 9 show processing steps and respective semiconductor structures in accordance with aspects of the present invention.
Figure 2B:
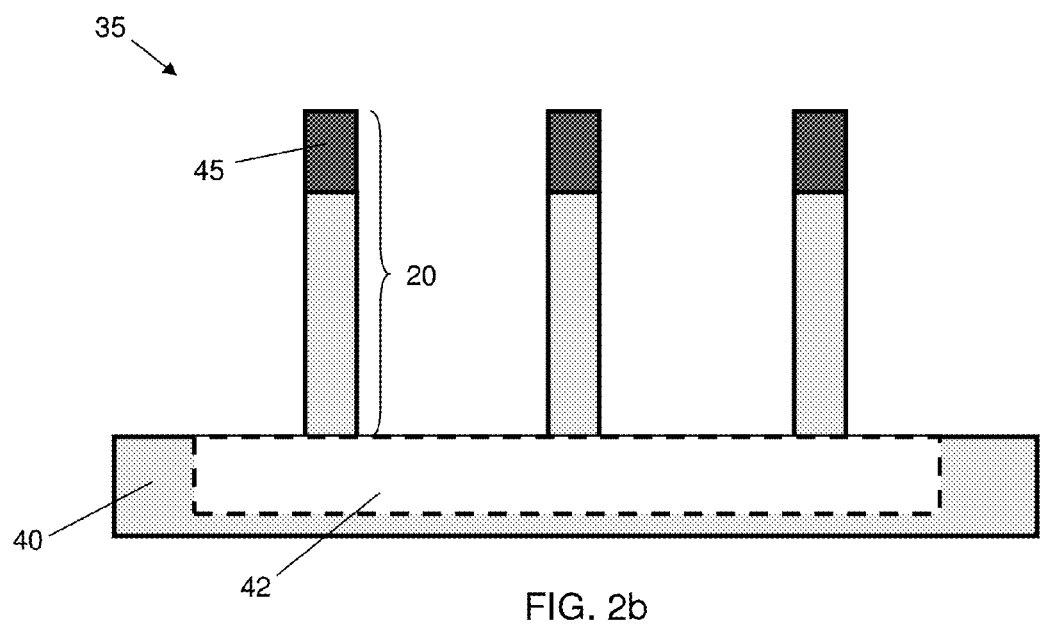

FIGS. 2a and 2b show structures and respective processing steps in accordance with aspects of the present invention. In particular, FIG. 2a is representative of a cutaway view of the finFET device 5 shown in FIG. 1, along line "x"; whereas, FIG. 2b is representative of a cutaway view of the finFET device 5 shown in FIG. 1, along line "y". As shown in FIGS. 2a and 2b, the structure 35 includes a bulk wafer 40. In embodiments, the bulk wafer 40 comprises a Si substrate; although other bulk semiconductor materials such as germanium, silicon germanium, compound semiconductors (III-V or II-VI compound semiconductors) are also contemplated by the present invention. In embodiments, the bulk finFET device may be fabricated as an N-type device (e.g., an nFET) or a P-type device (e.g., a pFET) with at least one well in the bulk wafer 40.

As shown in FIGS. 2a and 2b, a hardmask material 45 can be deposited on the wafer 40. In embodiments, the hardmask 45 can be a nitride material, formed using conventional deposition processes, e.g., chemical vapor deposition (CVD) processes. A plurality of fins 20 are formed from the bulk wafer 40 and hardmask material 45. The plurality of fins 20 can be formed in an uninterrupted pattern extending over source/drain regions 10 and well region 15 (as shown in FIG. 1). In embodiments, the plurality of fins 20 may be formed using conventional deposition, lithography and etching processes, e.g., sidewall imaging transfer techniques.

In more specific embodiments, an amorphous Si material may be formed on the hardmask 45, and conventionally patterned to form a mandrel. The patterning of the Si material can be achieved using any conventional lithography and etching (reactive ion etching) processes, known to accomplish such patterning techniques. After patterning, sidewall spacers are formed on both sides of the mandrel. The mandrel can then be removed, leaving the two sidewall spacers. The sidewalls spacers, in turn, can be used to pattern the fins 20. In embodiments, the fins 20 can have a width of about 5 nm to about 20 nm, a height of about 40 nm to about 150 nm, and a pitch of about 20 nm to about 100 nm; although other dimensions are also contemplated by the present invention.

FIG. 2b shows an nFET device for illustrative purposes; however, it should be understood by those of skill in the art that FIG. 2b can also be representative of a pFET device. Specifically, in FIG. 2b, a P-well 42 is formed in the bulk wafer 40. For example, the P-well 42 may be formed by a P-type implantation using conventional implantation processes, e.g., a boron ion implantation. In the alternative instance in which an N-well is being formed, a phosphoric or arsenic ion implantation may be utilized.

Figure 3A:
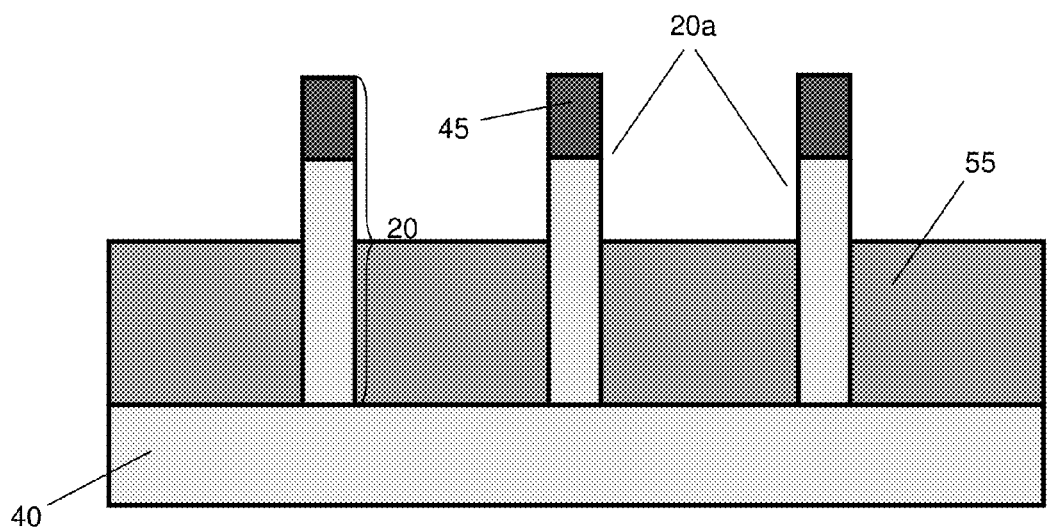
Figure 3B:
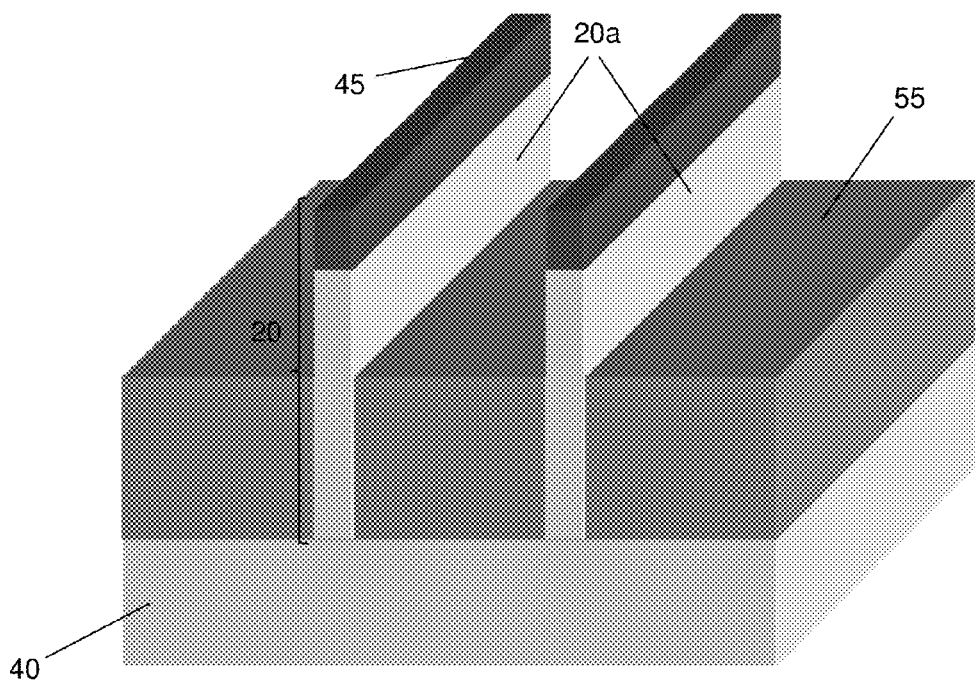

In FIGS. 3a and 3b, shallow trench isolation (STI) regions 55 are formed on the sides of the fins 20. In particular, FIG. 3a is representative of a cutaway view of the finFET device 5 shown in FIG. 1, along line "x", and FIG. 3b is representative of a perspective view also along line "x". However, it should be understood that the same processes illustrated in FIGS. 3a and 3b being performed for the source/drain regions 10 are also performed simultaneously or subsequently for the well region 15 (e.g., along line "y" shown in FIG. 1).

In embodiments, the STI regions 55 can be formed using a conventional CVD or spin on process, on the substrate 40. The STI regions 55 can be formed from oxide or other insulator material. In more specific embodiments, the STI regions 55 can be formed by depositing an oxide material (e.g., a dielectric material) over the fins 20, and planarizing the oxide material to the hardmask material 45 using a conventional chemical mechanical polishing (CMP) process. In one or more embodiments, the oxide material may be etched to form a recessed portion, exposing a portion of the sidewalls 20a of the fins 20. In embodiments, the sidewalls 20a can be exposed to a height of about 15 nm to about 30 nm; although other dimensions are also contemplated by the present invention. In alternative embodiments, the fins 20 can be formed with a taper such that the fins 20 are wider below the STI regions 55.

Figure 4A:
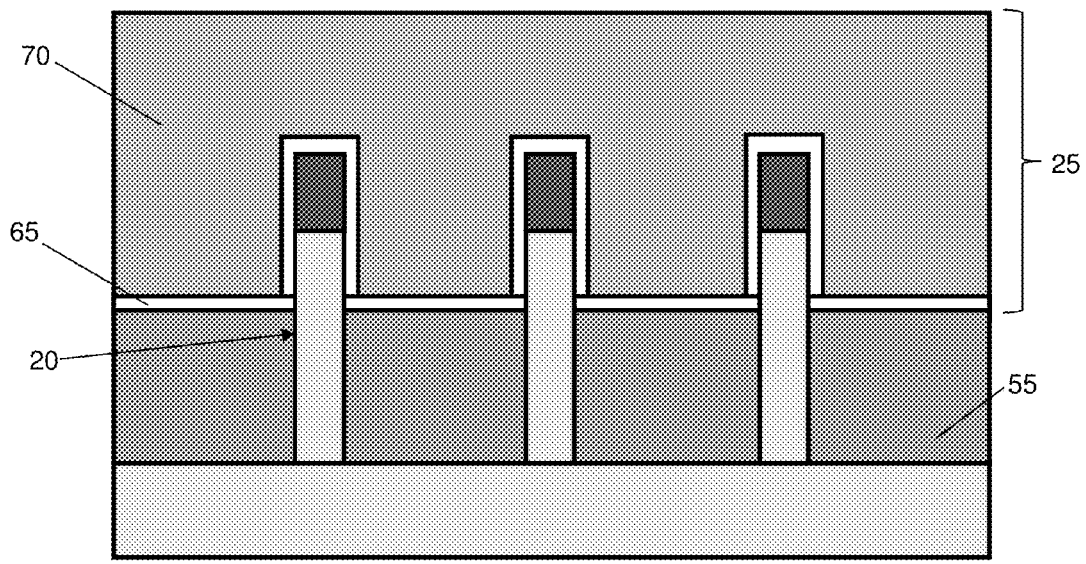
Figure 4B:
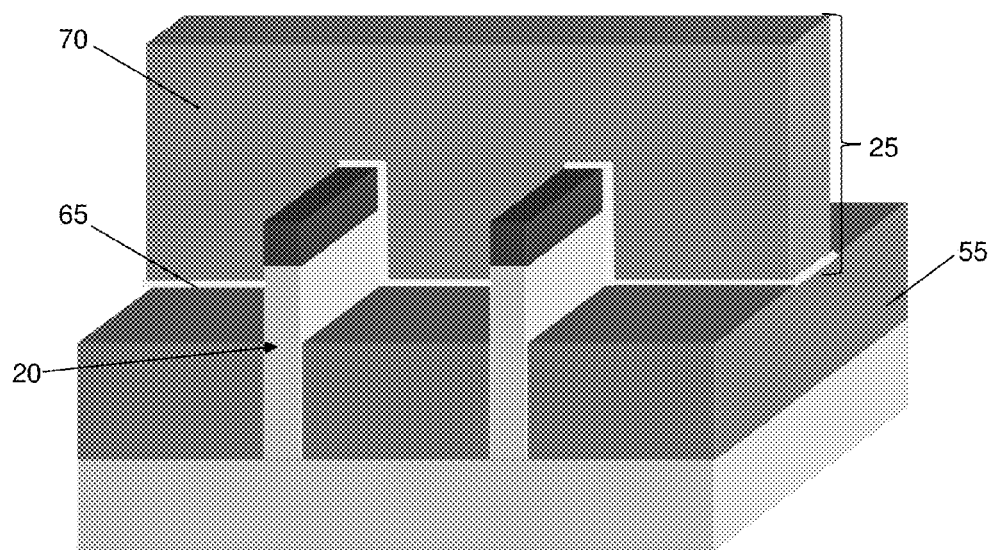

In FIGS. 4a and 4b, a gate structure 25 is formed over the STI regions 55 and the fins 20, e.g., perpendicular to the fins, using conventional processes. In particular, FIG. 4a is representative of a cutaway view of the finFET device 5 shown in FIG. 1, along line "x", and FIG. 4b is representative of a perspective view also along line "x". It should be understood that the same processes illustrated in FIGS. 4a and 4b being performed for the source/drain regions 10 are also performed simultaneously or subsequently for the well region 15 (e.g., along line "y" shown in FIG. 1).

In embodiments, in a gate-last process, a dielectric material 65 is deposited over the STI regions 55 and the fins 20, using conventional deposition methods such as, for example, CVD. The dielectric material 65 can be an oxide material, e.g., $SiO_2$. A polysilicon material 70 is then formed over the dielectric material 65, using an atomic layer deposition (ALD) process, for example. The dielectric material 65 and the polysilicon material 70 can then be patterned, for example, using conventional lithography and etching processes, to form the gate structure 25 of FIGS. 4a and 4b.

In alternate embodiments, the gate structure 25 can be formed in a gate-first process. In this example, the dielectric material 65 can be a high-k material such as, for example, a hafnium oxide or other hafnium based material. The thickness of the gate dielectric material 65 can vary depending on the required device performance. The gate material 70 can be any gate metal such as, for example, aluminum lined with a workfunction metal, e.g., TiN or TaN (although other workfunction metals are also contemplated by the present invention).

Figure 5A:
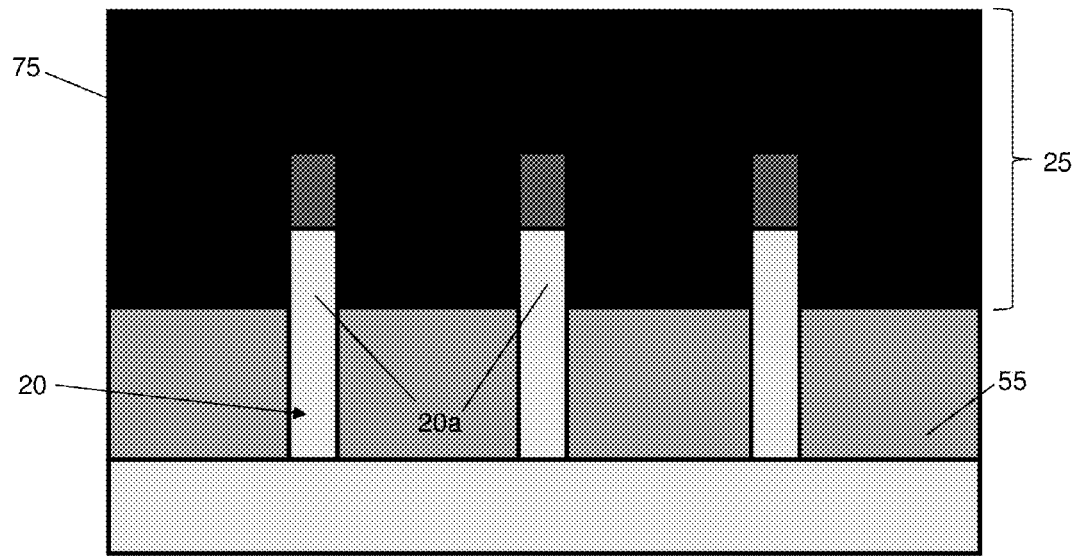
Figure 5B:
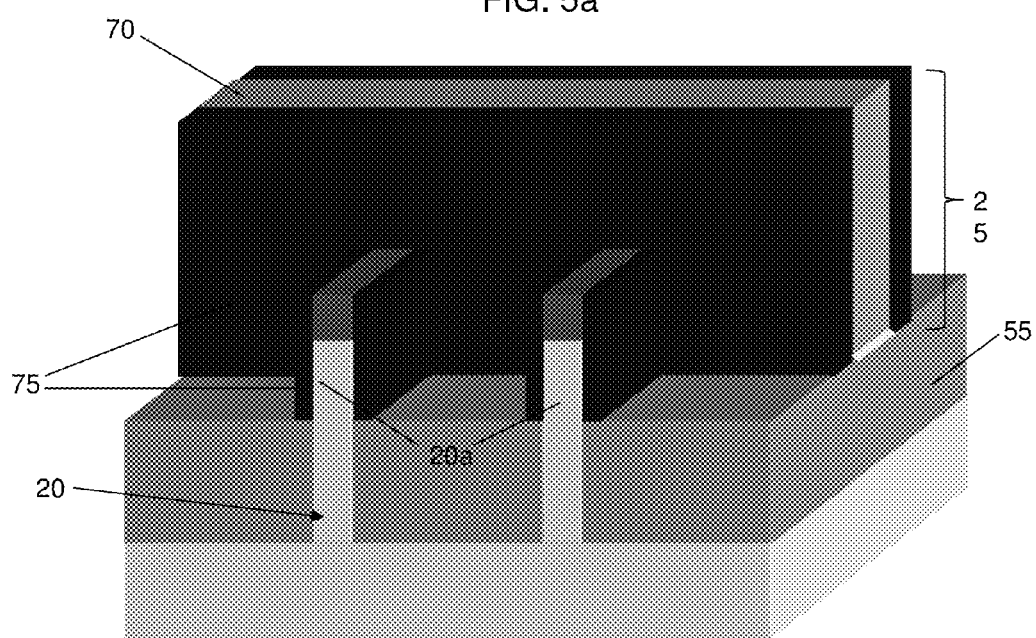

In FIGS. 5a and 5b, optionally a sidewall material 75 may be deposited on the gate structure 25, e.g., over the gate material 70. In particular, FIG. 5a is representative of a cutaway view of the finFET device 5 shown in FIG. 1, along line "x", and FIG. 5b is representative of a perspective view also along line "x". It should be understood that the same processes illustrated in FIGS. 5a and 5b being performed for the source/drain regions 10 are also performed simultaneously or subsequently for the well region 15 (e.g., along line "y" shown in FIG. 1).

In embodiments, the sidewall material 75 may also be formed over the exposed walls 20a of the fins 20. The sidewall material 75 can be a nitride material, deposited to a thickness of about 4 nm to about 12 nm; although other dimensions are also contemplated by the present invention. In embodiments, the nitride material can be deposited using a conventional CVD process, followed by a RIE cleaning process. As should be understood by those of skill in the art, the RIE cleaning process would remove the nitride material from horizontal surfaces, e.g., STI regions 55.

Figure 6A:
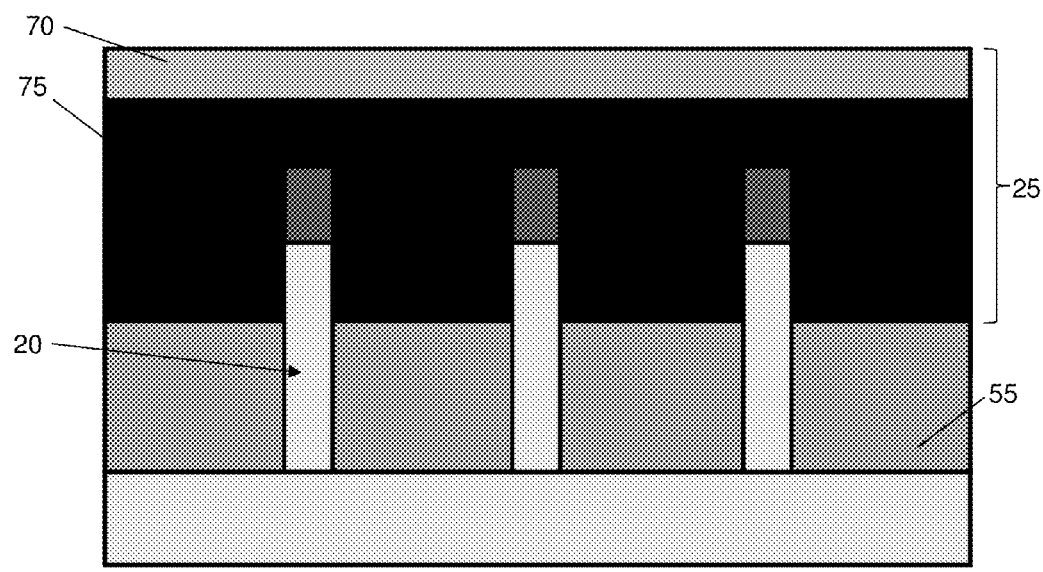
Figure 6B:
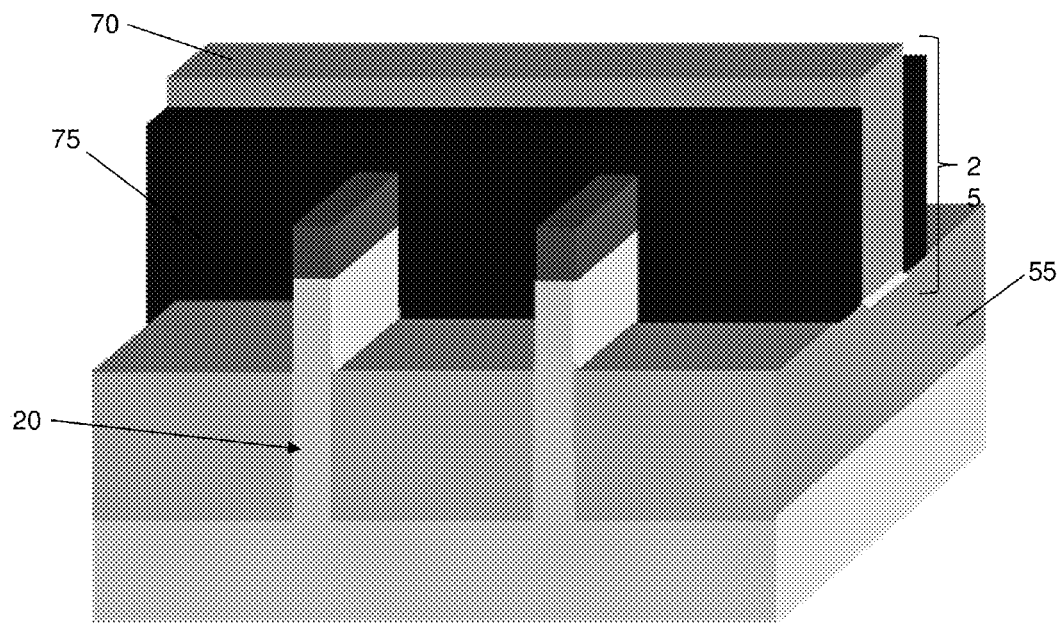

In FIGS. 6a and 6b, optionally the sidewall material 75 is removed from the fins 20. In particular, FIG. 6a is representative of a cutaway view of the finFET device 5 shown in FIG. 1, along line "x", and FIG. 6b is representative of a perspective view also along line "x". It should be understood that the same processes illustrated in FIGS. 5a and 5b being performed for the source/drain regions 10 are also performed simultaneously or subsequently for the well region 15 (e.g., along line "y" shown in FIG. 1).

In this process, the removal of the sidewall material will expose an upper portion of the fins 20. In embodiments, this process will also pull down the sidewalls on the gate structure 25, e.g., the poly material 70 (and may remove some height of the gate material 70). The pull down or removal process can be performed by, for example, a conventional RIE process.

Figure 7A:
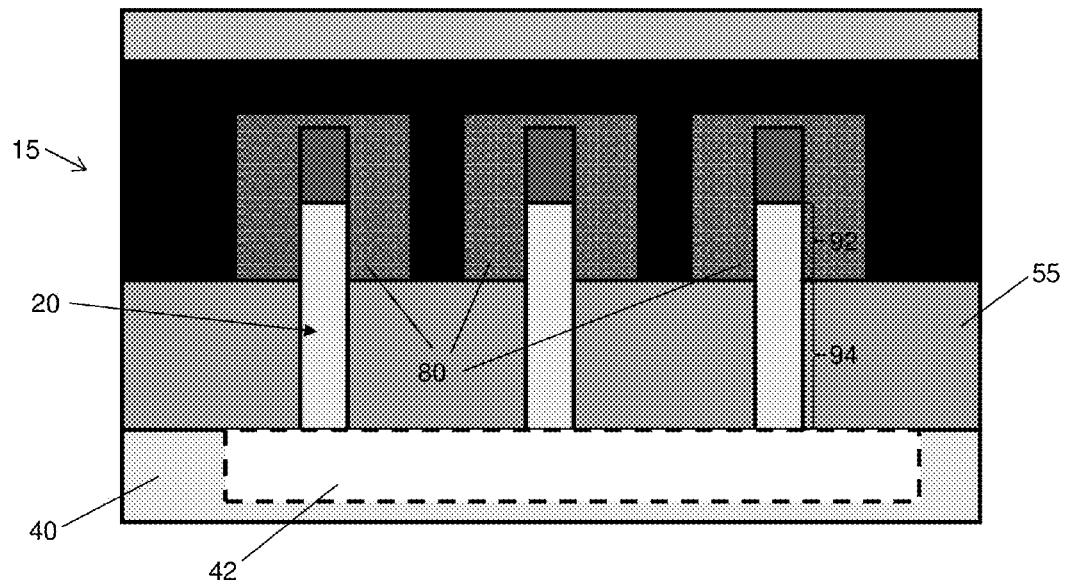
Figure 7B:
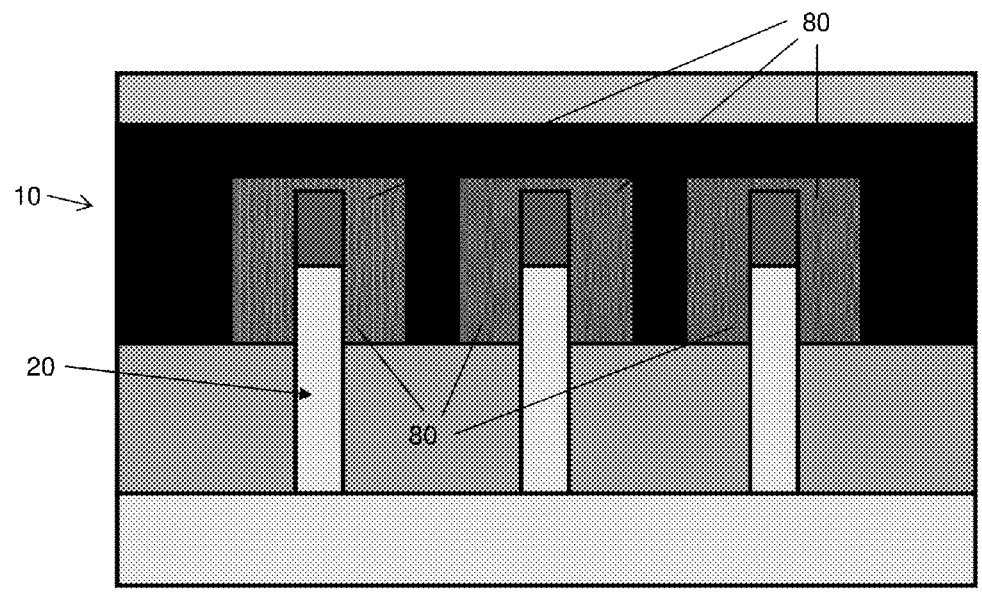
Figure 7C:
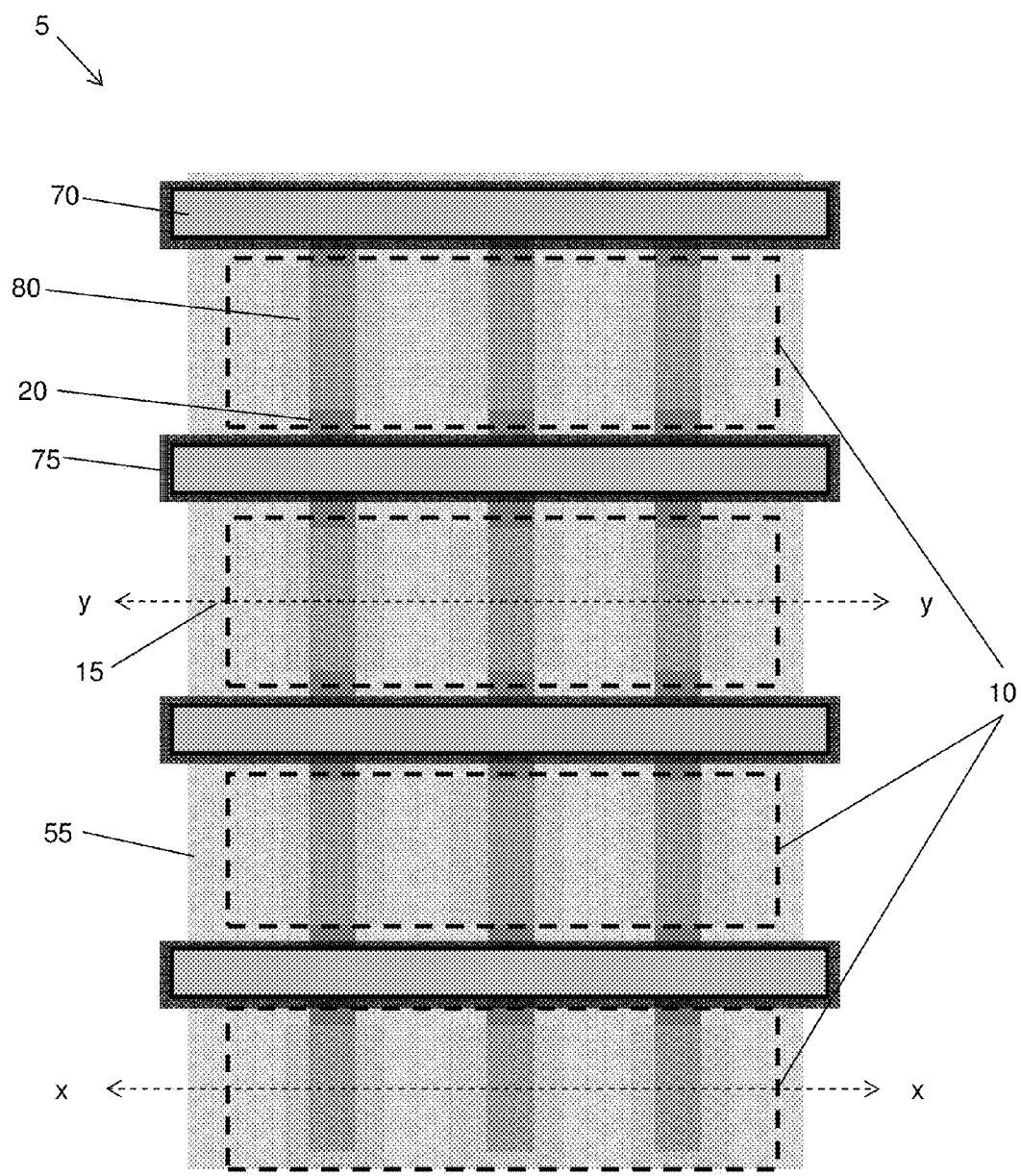

As shown in FIGS. 7a and 7c well region 15 and source/drain regions 10 (shown in FIGS. 7b and 7c) are formed using a double masking process. In particular, FIG. 7a is representative of a cutaway view of the finFET device 5 shown in FIG. 7c, along line "y", and FIG. 7b is representative of a cutaway view along line "x". FIG. 7c shows plan views of FIGS. 7a and 7b.

In embodiments, the bulk finFET device 5 may be fabricated as an nFET or a pFET. As such, it should be understood by those of ordinary skill in the art that the order of forming the source/drain regions 10 and well region 15, and the conductivity provided for each region, may be reversed from that illustrated and described herein. As shown in FIGS. 7a and 7b, an epitaxial growth process may be used to form the source/drain regions 10 and well region 15 by forming the epitaxial layer 80 locally around the fins 20. In embodiments, the epitaxial layer 80 is formed by an epitaxial growth process (e.g., vapor-phase epitaxy (VPE)) with in-situ doping to form the source/drain regions 10 and well region 15. For example, the epitaxial layer 80 can be doped during deposition (i.e., in-situ) by adding impurities to the source gas, such as diborane, arsine, or phosphine. The concentration of impurity in the gas phase determines its concentration in the deposited film. In alternative embodiments, the epitaxial layer 80 is formed by an epitaxial growth process and then dopants (e.g., boron, phosphorus or arsenic) are subsequently introduced into the epitaxial layer 80 via ion implantation to form the source/drain regions 10 and well region 15.

Specifically, a first block mask can be formed over the source/drain regions 10 (shown in FIGS. 7b and 7c) to protect those regions from receiving epitaxial growth with in situ doping or ion implantation of a first conductivity type. The mask material may be comprised of conventional mask material that inhibits epitaxial growth with in situ doping or the penetration of ions into the blocked regions, e.g., the well region 15. For example, to form an nFET, the source/drain regions 10 may be blocked by the first block mask while the well region 15 (shown in FIGS. 7a and 7c) is epitaxially grown with P-type in situ doping or ion implantation, e.g., a diborane in situ or boron ion implantation.

As should be understood by those of skill in the art, the dopants are driven into the fins 20. Typical doping concentrations of the epitaxial layer range from $1\times10^{21}$ to $3\times10^{22}$ dopant atoms/cm$^3$. Specifically, a first region 92 of the fins 20 surrounded by the epitaxial layer 80 and a second region 94 of the fins 20 penetrating through the STI regions 55 receive a sufficient amount of dopants through the epitaxial layer 80 such that a contiguous charge-neutral zone is formed from the epitaxial layer 80 to the P-well 42 formed in the bulk wafer 40. Typical doping concentrations for the first region 92 of the fins range from $3\times10^{19}$ to $6\times10^{21}$ dopant atoms/cm$^3$. Typical doping concentrations for the second region 94 of the fins range from $1\times10^{18}$ to $6\times10^{19}$ dopant atoms/cm$^3$.

Subsequently, the first block mask is removed from the source/drain regions 10 and a second block mask is formed over the well region 15. Specifically, the second block mask is formed over the well region 15 to protect that region from receiving doping or ion implantation of a second conductivity. The block mask may be removed utilizing a conventional stripping, such as, for example, wet or dry stripping. Thus, to continue the fabrication of the nFET, the well region 15 may be blocked by the second block mask while the source/drain regions 10 are epitaxially grown (as shown in FIGS. 7b and 7c) with N-type in situ doping or ion implantation, e.g., an arsine or phosphine in situ or arsenic or phosphorus ion implantation. Following formation of the source/drain regions 10 the second block mask is removed.

In further embodiments, the epitaxial layer 80 can also be used for strain purposes, e.g., SiGe used for straining a pFET and Si:C used for straining an nFET. More specifically, in a pFET implementation, the epitaxial layer 80 of the source/drain regions 10 can be a SiGe material with a p-type dopant, e.g., boron. In an nFET implementation, the epitaxial layer 80 of the source/drain regions 10 can be a Si:C material with an n-type dopant, e.g., arsenic and/or phosphorous. A thermal anneal can be performed to drive the dopants towards the channel to form extensions. In embodiments, the thermal anneal process can be a laser anneal process, rapid thermal anneal process, flash anneal process, furnace anneal process, or other known annealing processes to drive the dopants into the fins 20. Any suitable combination of those anneal processes is also conceived.

Figure 7D:
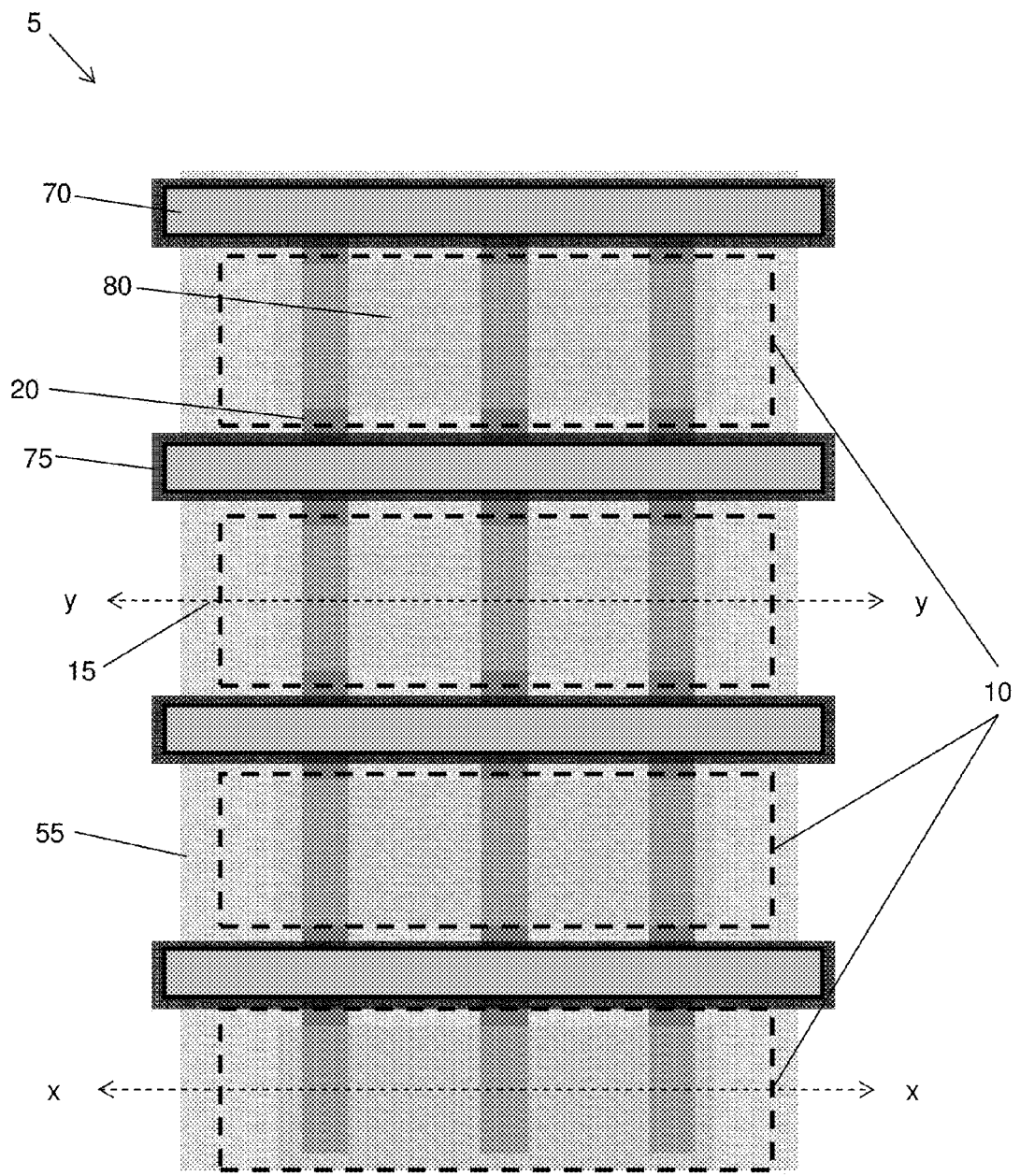

FIG. 7d is an alternative plan view of FIGS. 7a and 7b. Specifically, in alternative embodiments, the epitaxial layer 80 may be grown to merge between the fins 20.

Figure 8:
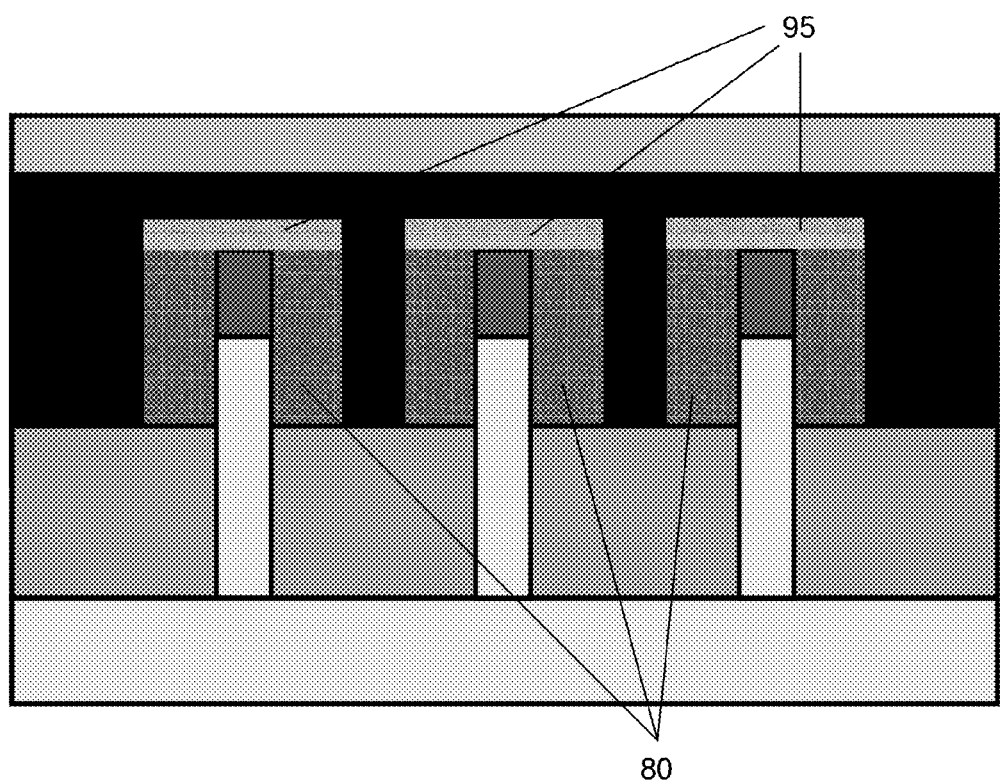

As shown in FIG. 8, optionally silicide regions 95 may be formed on the epitaxial layer 80 in any suitable manner. In particular, FIG. 8 is representative of a cutaway view of the finFET device 5 shown in FIG. 7c, along line "x". It should be understood that the same processes illustrated in FIG. 8 being performed for the source/drain regions 10 are also performed simultaneously or subsequently for the well region 15 (e.g., along line "y" shown in FIG. 7c).

For example, the silicide regions 95 may be formed over the source-drain regions 10 and the well region 15. Particularly, the silicide regions 95 may be formed by selectively sputtering a cobalt (or nickel) film onto the source-drain regions 10 and the well region 15, and annealing the film to form a cobalt (or nickel) silicide. In embodiments, the silicide may have a thickness of about 20 nm to 40 nm, although other thicknesses may be used within the scope of the invention.

In alternative processes comprising a gate-late process (as discussed above with respect to FIGS. 4a and 4b), the gate structure 25 can be removed and replaced with a metal gate prior to or after the siliciding and/or doping of the source/drain regions 10 and well region 15, as should be understood by those of skill in the art. In this alternative implementation, the gate structure 25 can be removed by an etching process, e.g., RIB, to form a trench. A dielectric material and gate metal can then be deposited within the trench. For example, a high-k dielectric material, e.g., hafnium based material, can be deposited to form a gate dielectric. A metal liner, e.g., workfunction metal, and a gate metal can then be deposited on the dielectric material to complete the gate formation. In embodiments, the metal liner can be, for example, TiN or TaN; whereas, the gate metal can be aluminum or tungsten.

Figure 9:
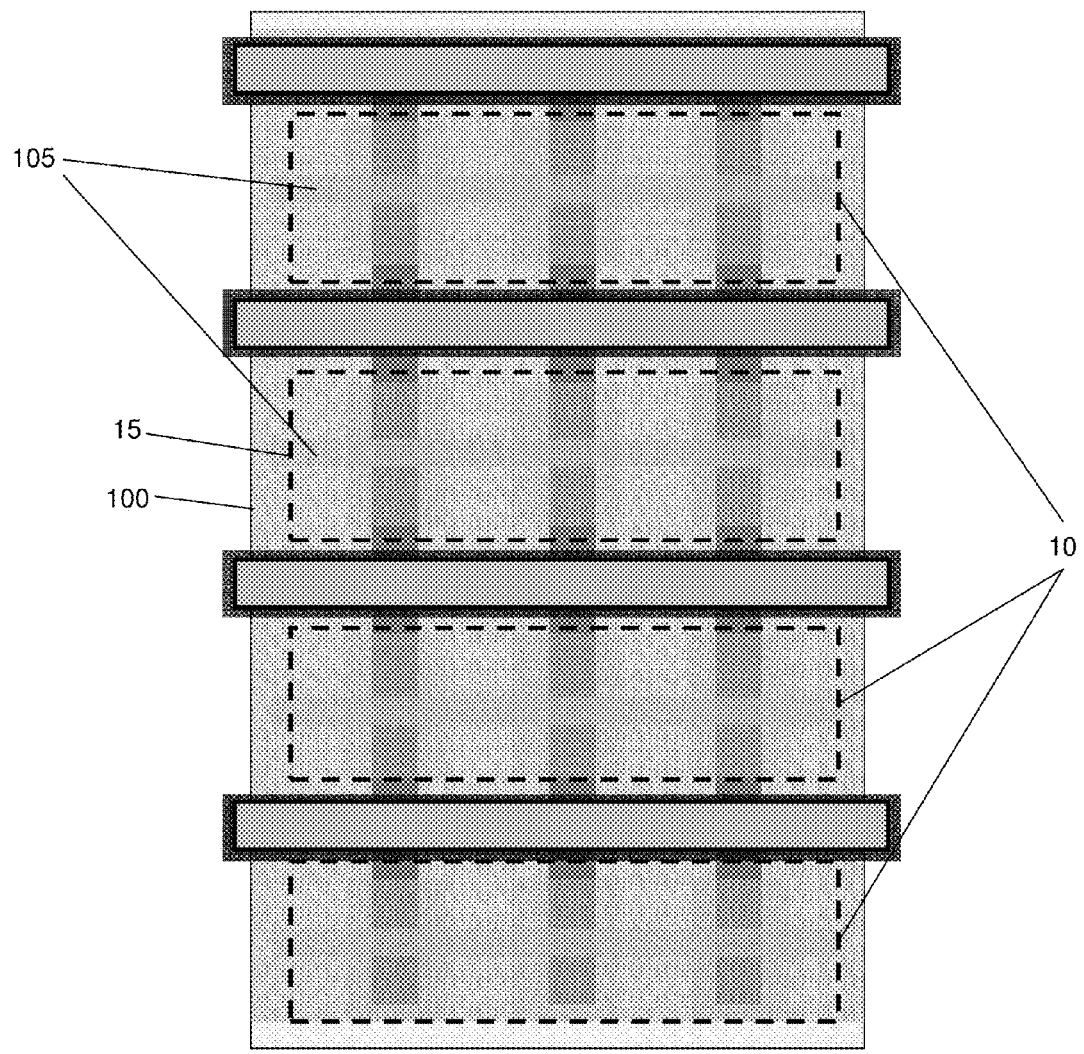

FIG. 9 shows an interlevel dielectric (ILD) layer 100 deposited on the exposed surfaces, which is thereafter planarized using, for example, a chemical mechanical polishing (CMP) process. The ILD layer 100 may comprise any suitable dielectric material, for example, $SiO_2$, tetraethyl orthosilicate (TEOS), borophosphosilicate glass (BPSG), high density plasma (HDP) oxide, etc. The ILD layer 100 may be deposited in any suitable manner such as CVD and may be planarized using CMP.

As further depicted in FIG. 9, contacts 105 may be formed in the ILD layer 100 to the source/drain regions 10 and the well region 15. Any suitable contacts 105 may be formed using conventional materials and semiconductor fabrication techniques. For example, in embodiments, the contacts 105 may comprise a liner and conductive material, formed by forming contact holes in the ILD layer 100 to, or slightly below, the upper surfaces of the source/drain regions 10 and the well region 15. If silicide was previously formed on these features (e.g., the silicide regions 95), then the contact holes may be formed to, or slightly below, the upper surface of the silicide. The liner is formed on the exposed surfaces of the contact holes. The liner may comprise, for example, Ta, TaN, Ti, TiN, Ru, RuN, W, WN, or any other material that can serve as a barrier to prevent conductive material from diffusing therethrough. The contact holes are filled with a conductive material such as, for example, Cu, W, Al, Cu alloys, etc.

Figure 10:
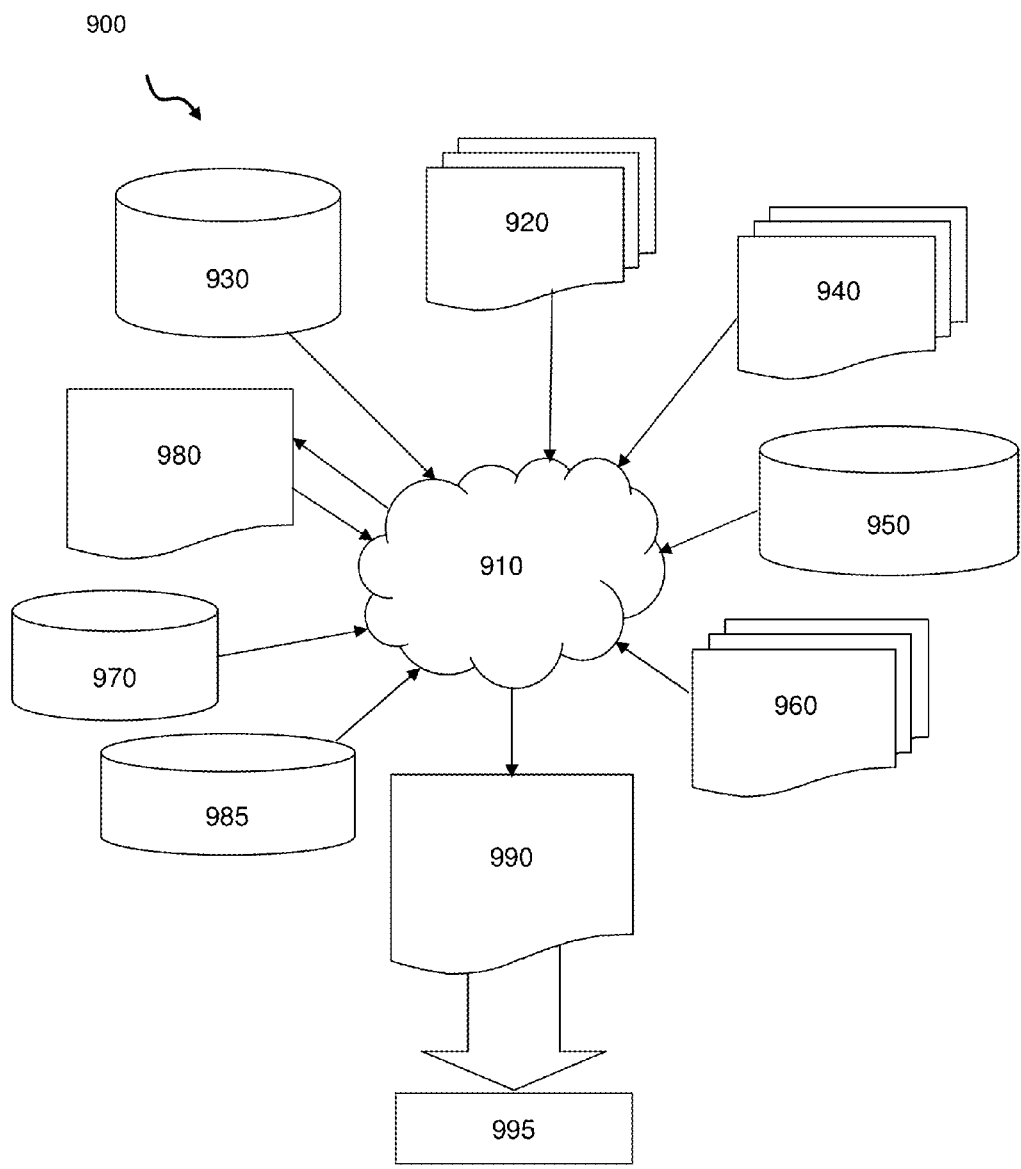
FIG. 10 is a flow diagram of a design process used in semiconductor design, manufacture, and/or test.

FIG. 10 is a flow diagram of a design process used in semiconductor design, manufacture, and/or test. FIG. 10 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1, 2a, 2b, 3a, 3b, 4a, 4b, 5a, 5b, 6a, 6b, 7a-7d, 8 and 9. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1, 2a, 2b, 3a, 3b, 4a, 4b, 5a, 5b, 6a, 6b, 7a-7d, 8 and 9. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1, 2a, 2b, 3a, 3b, 4a, 4b, 5a, 5b, 6a, 6b, 7a-7d, 8 and 9 to generate a netlist 980, which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1, 2a, 2b, 3a, 3b, 4a, 4b, 5a, 5b, 6a, 6b, 7a-7d, 8 and 9. In one embodiment, design structure 990 may comprise a compiled, executable HDL simulation model that functionally simulates the devices shown in FIGS. 1, 2a, 2b, 3a, 3b, 4a, 4b, 5a, 5b, 6a, 6b, 7a-7d, 8 and 9.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 2a, 2b, 3a, 3b, 4a, 4b, 5a, 5b, 6a, 6b, 7a-7d, 8 and 9. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
providing a substrate with a first region and a second region, each extending longitudinally in a first direction, the first region comprising a well with a first conductivity;
forming contiguous fins over the first region and the second region in a manner that the fins extend longitudinally in a second direction, substantially perpendicular to the first direction;
forming a gate structure between the first region and the second region in a manner that the gate structure extends longitudinally in the first direction substantially parallel to the first and second regions;
forming an epitaxial layer on at least one portion of the fins in the first region and at least one portion of the fins in the second region;
doping the epitaxial layer in the first region with a first type dopant to provide the first conductivity;
doping the epitaxial layer in the second region with a second type dopant to provide a second conductivity; and
forming an interlevel dielectric layer over the gate structure, the first region, and the second region,
wherein the first region is a well contact region and the second region includes a plurality of source/drain regions, and
wherein the first region is devoid of source/drain regions.

2. The method of claim 1, wherein the first type dopant is provided at a sufficient concentration to drive the first type dopant into the fins in the first region.

3. The method of claim 1, wherein the fins in the first region create a contiguous charge-neutral zone from the epitaxial layer to the well.

4. The method of claim 1, further comprising forming a dielectric layer on the substrate such that the dielectric layer surrounds a first portion of the fins.

5. The method of claim 4, wherein the forming the epitaxial layer comprises forming the epitaxial layer on the at least one portion of the fins in the first region of the substrate and on the at least one portion of the fins in the second region of the substrate such that the epitaxial layer surrounds a second portion of the fins.

6. The method of claim 5, wherein the first type dopant is provided at a sufficient concentration to drive the first type dopant into the first portion and the second portion of the fins in the first region.

7. The method of claim 6, wherein the first portion and the second portion of the fins in the first region create a contiguous charge-neutral zone from the epitaxial layer to the well through the dielectric layer.

8. The method of claim 1, wherein the forming and the doping the epitaxial layer in the first region comprises forming a first mask over the second region, and depositing the epitaxial layer over the first region, the depositing comprises an in situ doping process over the first region to provide the first conductivity.

9. The method of claim 8, wherein the forming and the doping the epitaxial layer in the second region comprises forming a second mask over the first region, depositing the epitaxial layer over the second region, the depositing comprises an in situ doping process of the epitaxial layer over the second region to provide the second conductivity.

10. A method comprising:
forming a well with a first conductivity type only in a first region of a substrate in a manner that the first region extends longitudinally in a first direction;
forming fins on the first region and a second region of the substrate in a uniform uninterrupted pattern in a manner that the fins extend longitudinally in a second direction which is substantially perpendicular to the first direction;
forming a gate structure between the first and second regions in a manner that the gate structure extends longitudinally in the first direction substantially parallel to the first and second regions;
forming a first epitaxial layer with the first conductivity type on at least one portion of the fins in the first region; and
forming a second epitaxial layer with a second conductivity type on at least one portion of the fins in the second region,
wherein the first region is a well contact region and the second region includes a plurality of source/drain regions, and
wherein the first region is devoid of source/drain regions.

11. The method of claim 1, wherein the first epitaxial layer is doped with a first type dopant at a sufficient concentration to drive the first type dopant into the fins in the first region.

12. The method of claim 1, wherein the fins in the first region create a contiguous charge-neutral zone from the first epitaxial layer to the well.

13. The method of claim 10, further comprising forming a dielectric layer on the substrate such that the dielectric layer surrounds a first portion of the fins in the first region.

14. The method of claim 13, wherein the forming the first epitaxial layer comprises forming the first epitaxial layer on the at least one portion of the fins in the first region such that the first epitaxial layer surrounds a second portion of the fins.

15. The method of claim 14, the first epitaxial layer is doped with a first type dopant at a sufficient concentration to drive the first type dopant into the first portion and the second portion of the fins.

16. The method of claim 15, wherein the first portion and the second portion of the fins create a contiguous charge-neutral zone from the epitaxial layer to the well through the dielectric layer.

17. The method of claim 10, wherein:
the forming the first epitaxial layer in the first region comprises forming a first mask over the second region, and depositing the epitaxial layer over the first region, the depositing comprises an in situ doping process of the first epitaxial layer over the first region to provide the first conductivity type; and
the forming the second epitaxial layer in the second region comprises forming a second mask over the first region, and depositing the epitaxial layer over the second region, the depositing comprises an in situ doping process of the second epitaxial layer over the second region to provide the second conductivity type.

* * * * *